(12) United States Patent
Frati

(10) Patent No.: US 8,575,565 B2
(45) Date of Patent: Nov. 5, 2013

(54) ION SOURCE APPARATUS AND METHODS OF USING THE SAME

(75) Inventor: Maximo Frati, Canton, MI (US)

(73) Assignee: Guardian Industries Corp., Auburn Hills, MI (US)

(*) Notice: Subject to any disclaimer, the term of this patent is extended or adjusted under 35 U.S.C. 154(b) by 107 days.

(21) Appl. No.: 13/269,795

(22) Filed: Oct. 10, 2011

(65) Prior Publication Data

US 2013/0088150 A1    Apr. 11, 2013

(51) Int. Cl.
 *H01J 1/50* (2006.01)
 *G21K 5/04* (2006.01)

(52) U.S. Cl.
 USPC ............... 250/423 R; 250/424; 315/111.01; 315/111.81

(58) Field of Classification Search
 USPC ............ 250/423 R, 424, 423 P, 423 F; 315/111.01, 111.11, 111.21, 111.31, 315/111.41, 111.51, 111.71, 111.81, 315/111.91, 111.61
 See application file for complete search history.

(56) References Cited

U.S. PATENT DOCUMENTS

| | | |
|---|---|---|
| 2,672,560 A | 3/1954 | Berry |
| 3,984,692 A | 10/1976 | Arsenault |
| 4,122,347 A | 10/1978 | Kovalsky et al. |
| 4,303,865 A | 12/1981 | Swingler |
| 4,401,539 A | 8/1983 | Abe et al. |
| 4,434,038 A | 2/1984 | Morrison, Jr. |
| 4,569,746 A | 2/1986 | Hutchinson |
| 4,572,776 A | 2/1986 | Aichert et al. |
| 4,595,482 A | 6/1986 | Mintz |
| 4,606,806 A | 8/1986 | Helmer |
| 4,652,795 A | 3/1987 | Lee et al. |
| 4,657,654 A | 4/1987 | Mintz |
| 4,661,228 A | 4/1987 | Mintz |
| 4,677,904 A | 7/1987 | Natsumeda et al. |
| 4,710,283 A | 12/1987 | Singh et al. |
| 4,865,710 A | 9/1989 | Aaron et al. |
| 4,865,712 A | 9/1989 | Mintz |
| 4,957,605 A | 9/1990 | Hurwitt et al. |
| 5,106,470 A | 4/1992 | Takei et al. |
| 5,130,607 A | 7/1992 | Lama |
| 5,315,121 A * | 5/1994 | Kluge et al. ............ 250/423 R |
| 5,407,551 A | 4/1995 | Sieck et al. |
| 5,415,754 A | 5/1995 | Manley |
| 5,508,368 A | 4/1996 | Knapp et al. |
| 5,646,476 A | 7/1997 | Aston |
| 5,656,819 A | 8/1997 | Greenly |
| 5,736,019 A | 4/1998 | Bernick |
| 5,763,989 A | 6/1998 | Kaufman |
| 5,851,365 A | 12/1998 | Scobey |
| 5,865,961 A | 2/1999 | Yokoyama et al. |
| 5,888,593 A | 3/1999 | Petrmichl et al. |
| 5,889,371 A | 3/1999 | Boyarsky et al. |
| 5,973,447 A | 10/1999 | Mahoney et al. |
| 6,002,208 A | 12/1999 | Maishev et al. |

(Continued)

*Primary Examiner* — Nicole Ippolito
(74) *Attorney, Agent, or Firm* — Nixon & Vanderhye P.C.

(57) ABSTRACT

An ion beam source that emits an ion beam in a direction of a substrate is provided. A cathode with a discharge opening defined therein is included. An anode is also included and spaced apart from the cathode. Ions are set to be emitted in an area proximate to the discharge opening in a direction similar to the direction from the anode to the discharge opening. First and second ceramic walls at least partially define a discharge channel between the anode and the cathode. At least one magnet generates a magnetic field in an area proximate to the discharge opening.

23 Claims, 7 Drawing Sheets

(56) References Cited

U.S. PATENT DOCUMENTS

| | | |
|---|---|---|
| 6,037,717 A | 3/2000 | Maishev et al. |
| 6,139,964 A | 10/2000 | Sathrum |
| 6,147,354 A | 11/2000 | Maishev et al. |
| 6,153,067 A | 11/2000 | Maishev et al. |
| 6,238,526 B1 | 5/2001 | Maishev et al. |
| 6,246,059 B1 | 6/2001 | Maishev et al. |
| 6,261,424 B1 | 7/2001 | Goncharenko et al. |
| 6,281,622 B1 | 8/2001 | Valentian et al. |
| 6,359,388 B1 | 3/2002 | Petrmichl |
| RE38,358 E | 12/2003 | Petrmichl |
| 6,812,648 B2 | 11/2004 | Luten et al. |
| 6,815,690 B2 | 11/2004 | Veerasamy et al. |
| 6,919,672 B2 | 7/2005 | Madocks |
| 6,987,364 B2 | 1/2006 | Petrmichl |
| 6,988,463 B2 | 1/2006 | Veerasamy et al. |
| 7,030,390 B2 | 4/2006 | Veerasamy et al. |
| 7,259,378 B2 | 8/2007 | Madocks |
| 7,488,951 B2 | 2/2009 | Murphy et al. |
| 7,872,422 B2 | 1/2011 | Murphy |
| 2005/0247885 A1 | 11/2005 | Madocks |
| 2006/0138342 A1 | 6/2006 | Liu et al. |
| 2008/0017112 A1 | 1/2008 | Murphy |

* cited by examiner

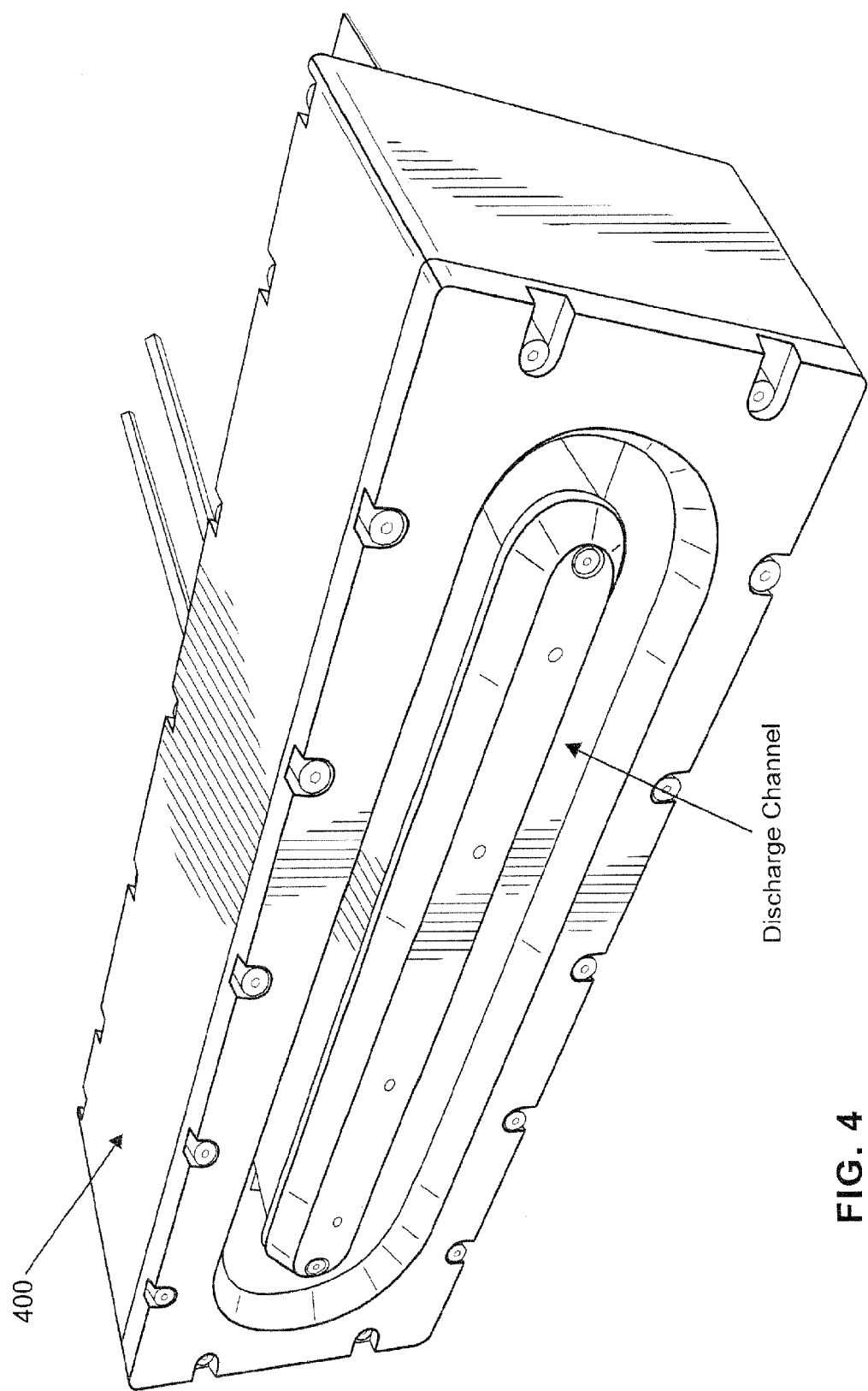

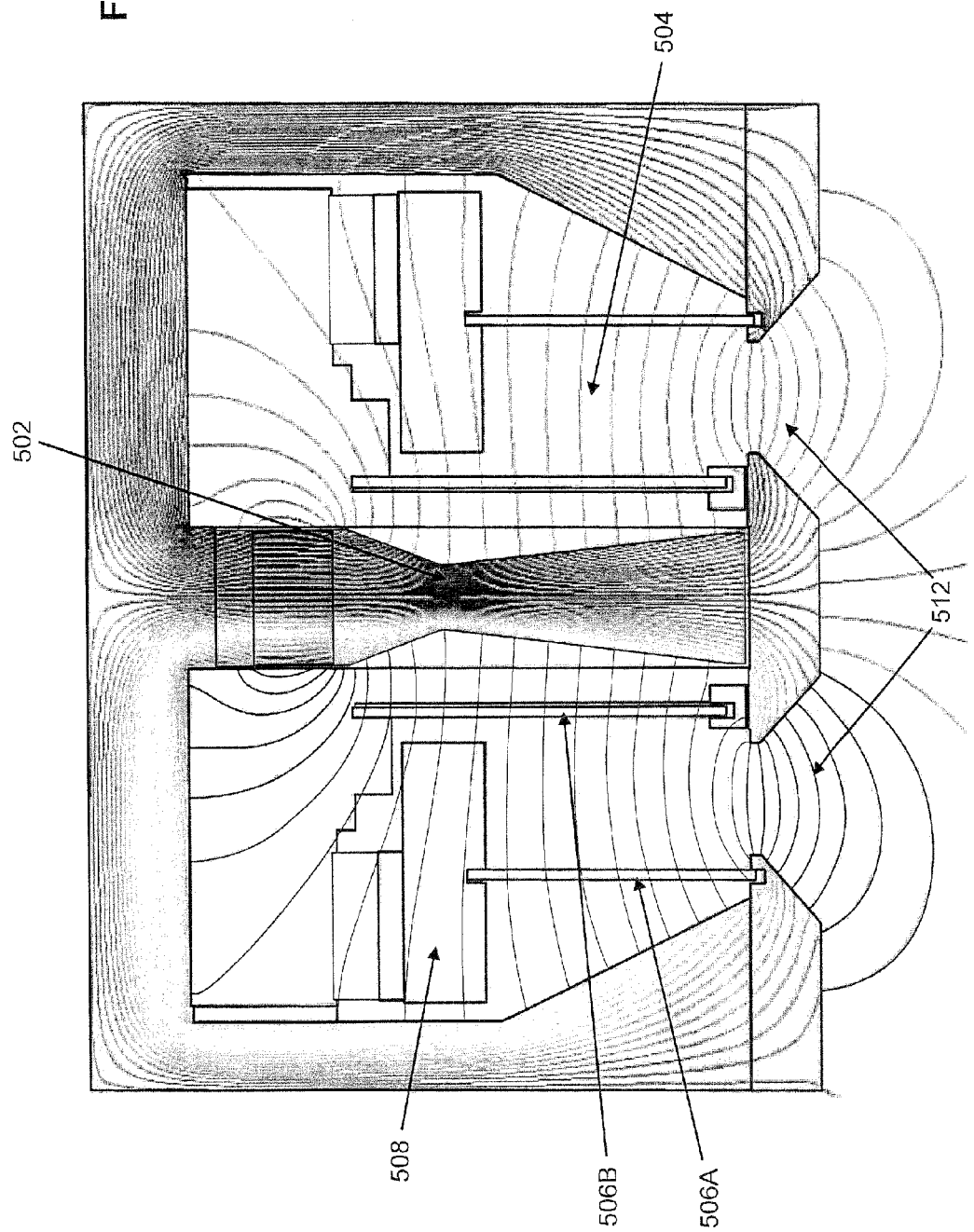

ION SOURCE APPARATUS AND METHODS OF USING THE SAME

FIELD OF THE INVENTION

Certain example embodiments herein relate to an ion source apparatus (e.g., for generating an ion beam) for large area substrate treatment and coating applications. More particularly, certain example embodiments relate to an ion source apparatus that uses closed drift magnetic layer techniques.

BACKGROUND AND SUMMARY OF EXAMPLE EMBODIMENTS OF THE INVENTION

An ion source is a device that ionizes gas molecules. The ionized molecules are then accelerated and emitted in a beam towards a substrate. The ionized beam may be used for cleaning, activation, polishing, etching, and/or deposition of thin-film coatings/layer(s). Example ion sources are disclosed, for example, in U.S. Pat. Nos. 7,872,422; 7,488,951; 7,030,390; 6,988,463; 6,987,364; 6,815,690; 6,812,648; 6,359,388; and Re. 38,358; the disclosures of each of which are hereby incorporated herein by reference.

FIGS. 1-2 illustrate a conventional closed drift of the anode layer type ion source. FIG. 1 is a side cross-sectional view of an ion beam source with an ion beam emitting slit defined in the cathode. FIG. 2 is a corresponding sectional plan view along section line II-II of FIG. 1. FIG. 3 is a sectional plan view similar to FIG. 2 and illustrates that the ion beam emitting gap may be generally ovular as opposed to generally circular in nature.

Referring to FIGS. 1-3, the ion source includes a hollow housing made of a magnetoconductive material such as steel, which is used as a cathode 5. Cathode 5 includes cylindrical or oval side wall 7, a closed or partially closed bottom wall 9, and an approximately flat top wall 11 in which a circular or oval ion emitting slit and/or aperture (also sometimes referred to as a "discharge gap") 15 is defined. Ion emitting slit/aperture 15 includes an inner periphery as well as an outer periphery. The portion of top cathode wall 5, 11 inside of the slit 15 may be considered the inner cathode, whereas the portion of the top cathode wall 5, 11 outside of the slit 15 may be considered the outer cathode. Deposit and/or maintenance gas supply aperture or hole(s) 21 is/are formed in bottom wall 9. A magnetic system including an array of magnets 23 with poles N and S of opposite polarity is placed inside the housing between bottom wall 9 and top wall 11. The purpose of the magnetic system with a closed magnetic circuit formed by the magnet 23 and cathodes 5 and 11, and is to induce a substantially transverse magnetic field (MF) in an area that is proximate to ion emitting slit 15.

The ion source may be entirely or partially within conductive wall 50, and/or wall 50 may at least partially define the deposition chamber. In certain instances, wall 50 may entirely surround the source and substrate 45, while in other instances the wall 50 may only partially surround the ion source and/or substrate.

A circular or oval shaped conductive anode 25, electrically connected to the positive pole of electric power source 29, is arranged so as to at least partially surround magnet 23 and be approximately concentric therewith. Anode 25 may be fixed inside the housing by way of insulating ring 31 (e.g., of ceramic). Anode 25 defines a central opening therein in which magnet 23 is located. The negative pole of electric power source 29 is connected to cathode 5 and may or may not be grounded, so that the cathode is negative with respect to the anode. Generally speaking, the anode 25 is generally biased positive by several thousand volts. Meanwhile, the cathode (the term "cathode" as used herein includes the inner and/or outer portions thereof) is generally held at ground potential. One example of a conventional ion source includes an anode having a flat top surface approximately 2 mm from the bottom of both the inner and outer cathodes.

The conventional ion beam source of FIGS. 1-3 is intended for the formation of a unilaterally directed tubular ion beam, flowing in the direction toward substrate 45. Substrate 45 may or may not be biased in different instances. The ion beam emitted from the area of slit/aperture 15 is in the form of a circle in the FIG. 2 embodiment and in the form of an oval (e.g., race-track) in the FIG. 3 embodiment. The conventional ion beam source of FIGS. 1-3 operates as follows in a depositing mode when it is desired that the ion beam deposit at least one layer on substrate 45. A vacuum chamber in which the substrate 45 and slit/aperture 15 are located is evacuated, and a depositing gas (e.g., a hydrocarbon gas such as acetylene, or the like) is fed into the interior of the source or in the background via aperture(s) 21 or in any other suitable manner. A maintenance gas (e.g., argon) may also be fed into the source in certain instances, along with or instead of the depositing gas. Power supply 29 is activated and an electric field is initially generated between anode 25 and cathode 5, which accelerates electrons to high energy. Anode 25 is positively biased by several thousand volts, and cathode 5 is at ground potential as shown in FIG. 1. Electron collisions with the gas in, and/or proximate to, aperture/slit 15 leads to ionization and a plasma is generated. "Plasma" herein means a cloud of gas including ions of a material to be accelerated toward substrate 45. The plasma expands and fills (or at least partially fills) a region including slit/aperture 15. An electric field is produced in slit 15, oriented in a direction that is substantially perpendicular to the transverse magnetic field, which causes the ions to propagate toward substrate 45. Electrons in the ion acceleration space in and/or proximate to slit/aperture 15 are propelled by the known E×B drift in a closed loop path within the region of crossed electric and magnetic field lines proximate to slit/aperture 15. These circulating electrons contribute to ionization of the gas (the term "gas" as used herein means at least one gas), so that the zone of ionizing collisions extends beyond the electrical gap between the anode and cathode and includes the region proximate to slit/aperture 15 on one and/or both sides of the cathode 5. For purposes of example, consider the situation where acetylene ($C_2H_2$) depositing gas is/are utilized by the ion source of FIGS. 1-3 in a depositing mode. The acetylene depositing gas passes through the gap between anode 25 and cathode 5.

The inventor of the instant application has recognized that it would be desirable to further improve upon conventional ion source designs.

For example, in certain instances, an ion source may have low dynamic deposition rates (DDR). This may be a consequence of designs that produce a high voltage/low current discharge operating regime (e.g., higher energy but fewer ions per unit of time).

As another example, when operating an ion source with carbon bearer precursors (e.g., for DLC film deposition), contamination may quickly build up on the different components of the ion source. This carbon debris accumulation combined with the source's geometry and stack up dimensions, and its high operating discharge voltages, may produce heavy arching and plasma instabilities which, in time, may cause the termination of the deposition process.

In certain instances, generation of high energy ions may be undesirable, for example in large area coating applications. In these instances, excessive energetic ion collisions may damage the integrity of the coating being deposited (e.g., when ion beam assisted deposition (IBAD) and/or post-deposition coating treatment is being used).

Thus, it will be appreciated that there is a need in the art for improved ion source devices and/or improved techniques of using ion source deposition.

In certain example embodiments, an exemplary ion source apparatus may be used for direct coating deposition (e.g., of diamond like carbon, etc.), substrate surface cleaning and activations, surface roughness alteration, ion beam assisted deposition for coating densification, dopant implantations, coating phase alteration, and/or the like.

In certain example embodiments, carbon based precursors, such as, for example, alkane, alkene, and/or alkyne inclusive gasses may be used. In certain example embodiments, a higher ion current density is achieved (e.g., more ions per unit of time).

In certain example embodiments, the discharge voltage may be relatively lower than that of conventional ion source devices. This may result in less energetic ions.

In certain example embodiments, the relationship between ion current density and depositions may results in higher ion beam current and higher process DDR.

In certain example embodiments, the construction of an ion source apparatus may reduce the carbon contamination build up incurred during the DLC deposition process.

In certain example embodiments, an ion beam source is provided that is configured to emit an ion beam in a direction of a substrate. The ion source includes a cathode that at least partially defines a discharge opening, the discharge opening having a predetermined width. An anode is located spaced apart from the cathode by a predetermined depth, the direction in which the ion beam is to be emitted being substantially parallel to a direction from the anode to the discharge opening in the cathode. First and second ceramic walls at least partially define a discharge channel between the anode and the cathode. At least one magnet is provided that is configured to generate a magnetic field in at least the discharge opening.

In certain example embodiments, a method of ion depositing a layer on a substrate is provided. An ion source is provided, with the ion source including: at least one cathode; an anode that is located proximate to an aperture defined in the cathode, the aperture having a predetermined width and a predetermined depth that separates the anode from the aperture; at least one magnet that generates a magnetic field proximate to the aperture defined in the cathodes; first and second ceramic barrier walls at least partially define a passage between the anode and the aperture in the cathode. Power is provided to the at least one magnet to generate the magnetic field. A gas is provided to an area proximate to the aperture defined in the cathode, the provided gas being ionized and emitted towards the substrate.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which:

FIG. 4 is a perspective view of an example ion source apparatus according to certain example embodiments;

FIG. 5C shows illustrative magnetic field lines of an example ion source apparatus according to certain example embodiments.

DETAILED DESCRIPTION OF EXAMPLE EMBODIMENTS OF THE INVENTION

Figure 1:
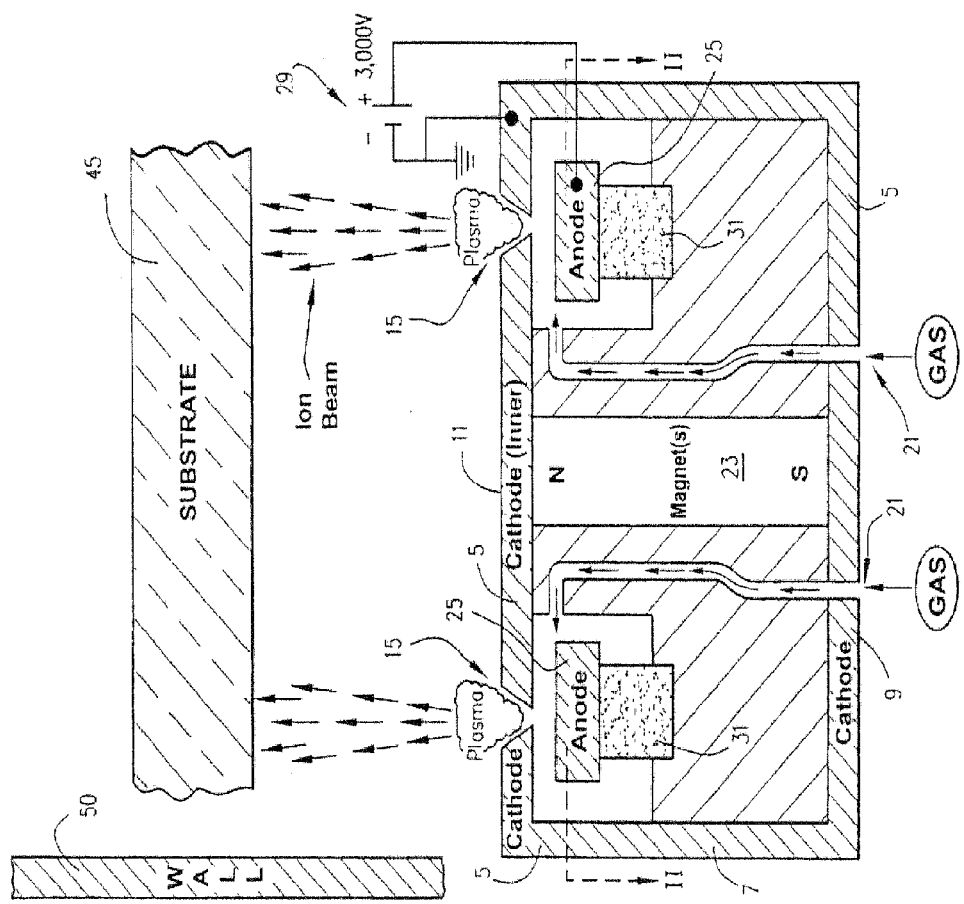
FIG. 1 is a schematic partial cross-section view of a conventional closed drift ion source of the anode layer type.
Figure 3:
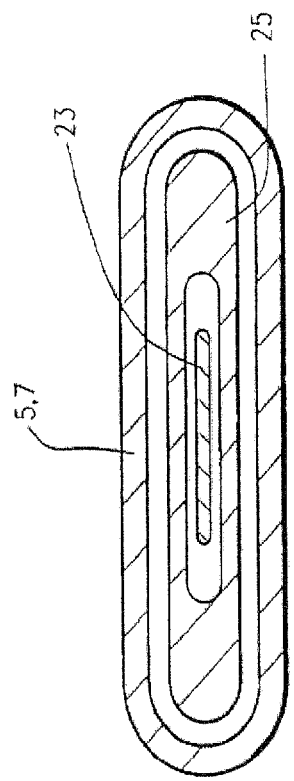
FIG. 3 is a section view similar to that of FIG. 2 along section line II, illustrating alternative ion source shapes.
Figure 2:
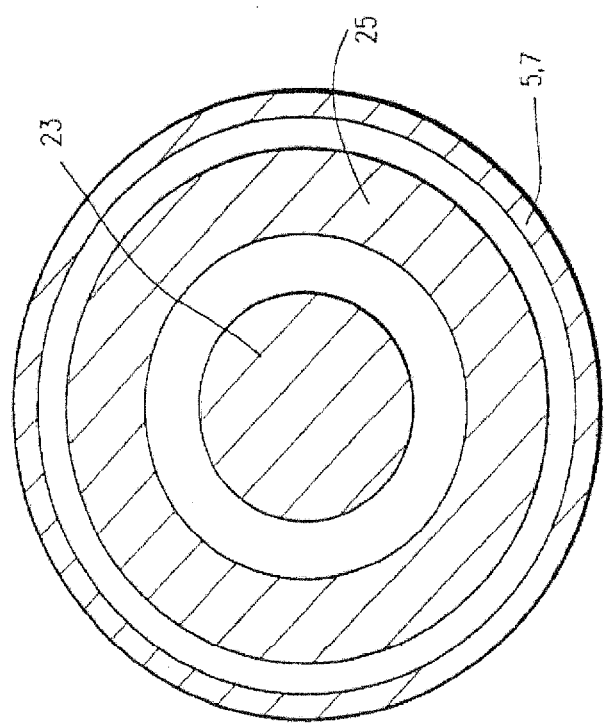
FIG. 2 is a sectional view along section line II of FIG. 1.

Referring now more particularly to the accompanying drawings in which like reference numerals indicate like parts/layers throughout the several views.

FIG. 4 is a perspective view of an example ion source apparatus according to certain example embodiments. As noted above, ion sources may come in different shapes (e.g., oval, circular, etc). Here, an example ion source 400 has a discharge channel 402 in the shape of an oval. The size of the ion source 400 may be adjusted depending on the needs of a given application(s). For example, the size (e.g., length) may range from about 400 mm to 4000 mm, or even larger or smaller. Such large sizes may be sufficient to meet large area coating requirements in certain example embodiments.

Figure 5A:
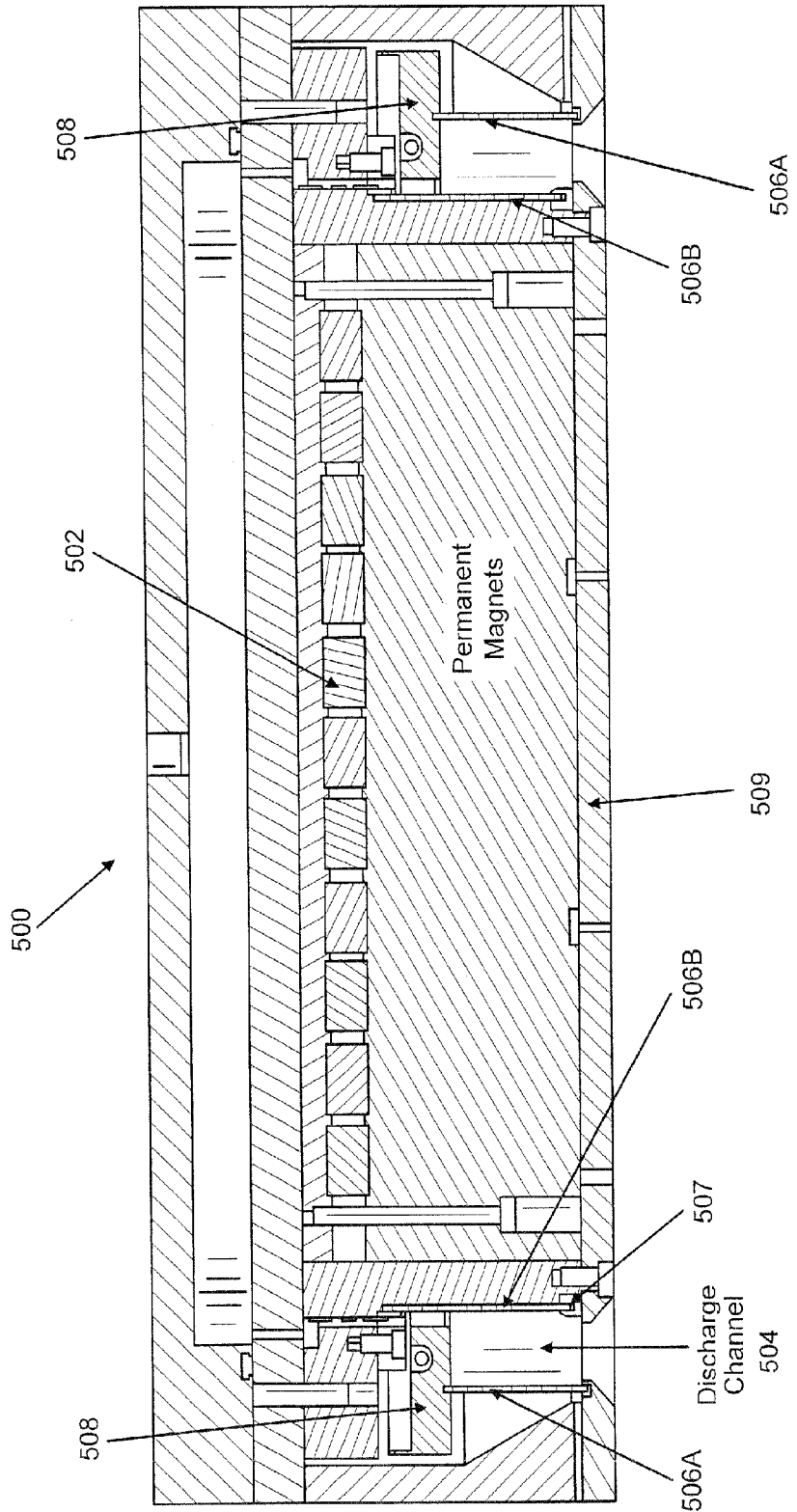
FIGS. 5A-5B show cross-sectional views of an example ion source apparatus according to certain example embodiments.
Figure 5B:
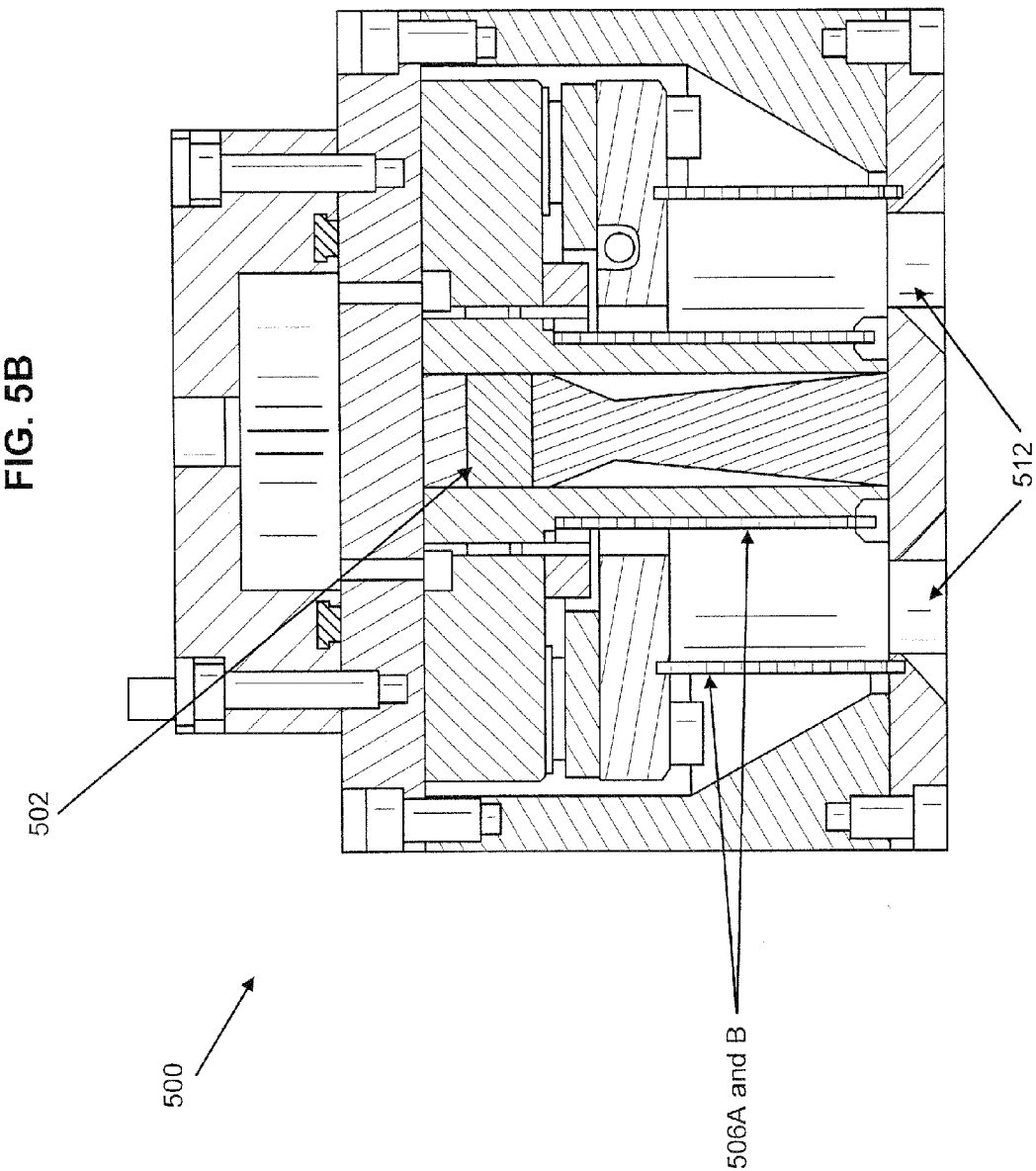

FIGS. 5A-5B show cross-sectional views of an example ion source apparatus according to certain example embodiments. The cross-sectional view of FIG. 5A may correspond to a length-wise cross-sectional view of the ion source shown in FIG. 4. Conversely, the cross-sectional view in FIG. 5B may be transverse to the view of FIG. 5B (e.g., width-wise). In any event, an ion source 500 may include one or more magnets 502 that are located in a substantially central portion of the ion source. Such magnets may facilitate or otherwise control the emission of ions from the ion source 500. One continuous magnet or magnet bar may be provided in certain embodiments. In other example embodiments, a segmented magnet assembly or a series of magnet portions may be provided within a body portion of the ion source 500. A discharge channel 504 may encompass the centrally located magnets 502. Anodes may be located above/below or behind (e.g., opposite the substrate from the cathode 509) the discharge channels 504.

In conventional ion source applications a discharge channel may be 2 mm in depth by 2 mm wide. In other words, in conventional applications the ratio between depth and width may be about 1-to-1 in terms of width-to-depth at the discharge channel.

In certain example embodiments, the width of the discharge channel may be between about 10 mm and 25 mm, or more preferably between 12-15 mm and 20 mm. In certain example embodiments, the width of the discharge channel may be about 16 mm. In certain example embodiments, the depth of the discharge channel (that may or may not include the discharge area—e.g., the exit plane 512) may be between about 25 mm and 55 mm or more preferably between about 30 mm and 50 mm. In certain example embodiments the depth may be about 40 mm. In certain example embodiments, a ratio between the depth and width of the discharge channel may be between 1.5 and 4 to 1, or more preferably between ratios of 2-2.5 to 1.

In certain example embodiments, one or more dimensions of the gap size may remain constant as the ion source is scaled up in size. For instance, in certain example embodiments, the length of the gap may be scaled up as the entire ion source is scaled up. In other example embodiments, however, the length of the gap may remain constant as the depth changes. In certain instances, additional adjustments may be made to the length and/or width of the discharge channel for tuning purposes once scaled up.

The discharge channel 504 may be formed out of ceramic refractory walls 506A and 506B. These refractory walls may vary in length (or depth). For example, as shown in FIG. 5A, refractory wall 506A may be shorter than walls 506B. Refractory walls 506B may run up past the anode 508 and refractory wall 506A may run to anode 508. The discharge channels may connect or interface with the exit plane 512 of the ion source apparatus 500.

The ceramic walls 506A and 506B may be made out of materials that include benzyl (BN), $BNSiO_2$, $Al_2O_3$, and/or the like. In certain example embodiments, such ceramic walls may provide low energy electrons (e.g., secondary electrons) to the plasma discharge. For example, electrons may be extracted by collisions of more energetic electrons and ions against the wall (e.g., by a secondary electron emission (SEE) phenomenon from ions and electron collisions against the refractory wall) This may create an overall thermalized discharge which, in combination with a tuned magnetic field density, originates extended ionizations and gradual acceleration regions without substantial space charge limitations (e.g., possibly because of the quasi-neutrality of the discharge provided by the secondary electron emission).

The presence of low energy secondary electrons may be advantageous in In certain example instances. For example, it may help facilitate thermalization of the plasma, thereby reducing the overall ion energy and operating voltages and creating a more gradual ion acceleration region. In addition, or in the alternative, it may provide electron excesses, thereby resulting in more ionizations and therefore higher discharge currents and/or deposition rates.

In certain example embodiments, an ion beam, for the same process conditions, may have between 3 and 8 (e.g., about 6) times lower ion energies and between about 2 and 10 times increased current density over ion beams from conventional anode layer ion source devices. Such characteristics may be desirable for large area depositions of diamond like carbon (DLC) coatings, IBAD processes, and/or the like. These results are believed to be superior to current approaches.

Figure 5D:
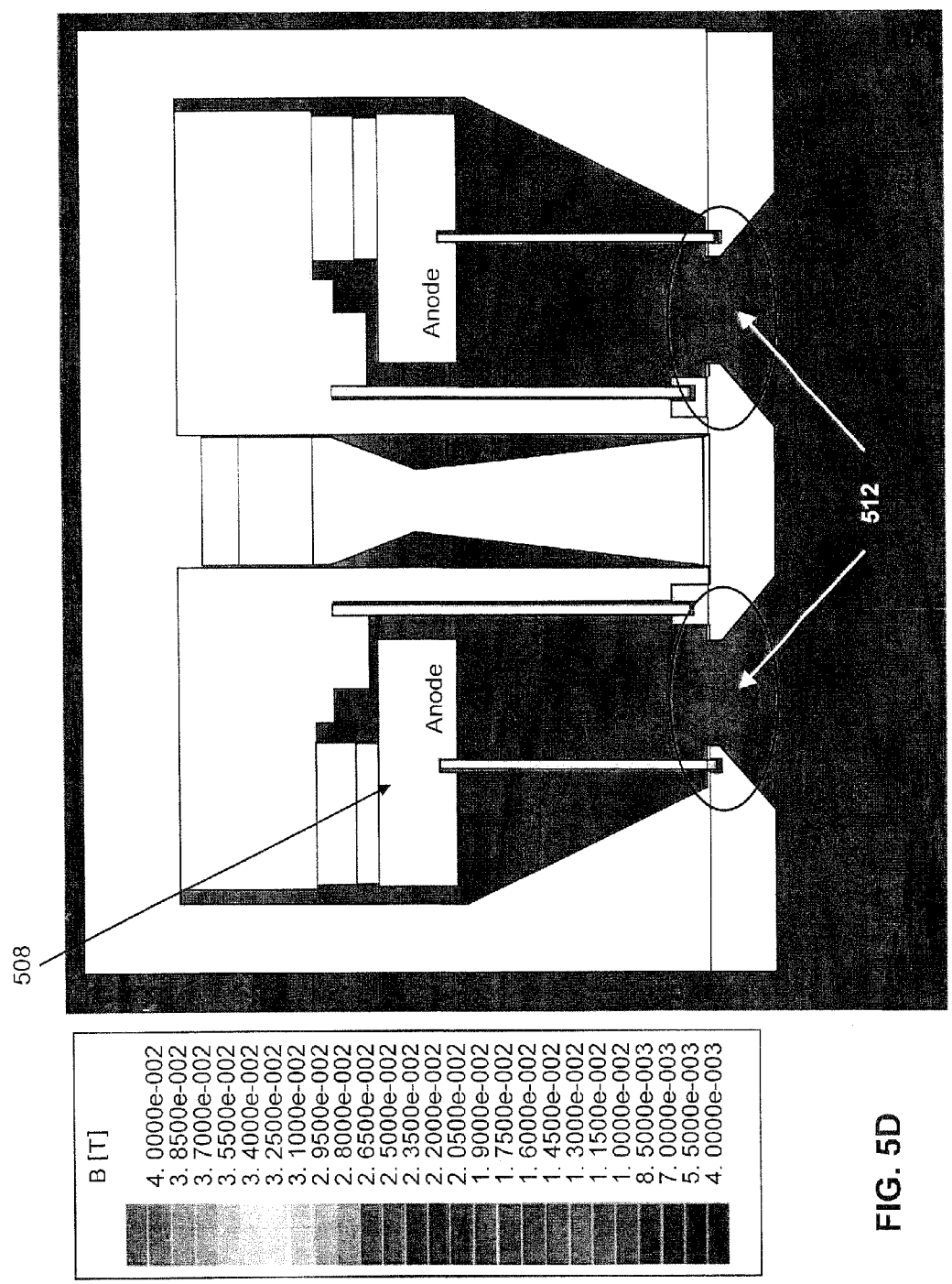
FIG. 5D shows illustrative magnetic field densities of an example ion source apparatus according to certain example embodiments.

FIG. 5C shows illustrative magnetic field lines of an example ion source apparatus according to certain example embodiments. FIG. 5D shows illustrative magnetic field densities of an example ion source apparatus according to certain example embodiments. In certain instances, the magnitude and/or geometry of the magnetic field density may be varied to achieve desirable operating efficiency of the ion source 500. Thus, in certain example embodiments, the magnetic field may be designed such that the magnetic field lines (shown in FIG. 5C) run across the discharge channel and/or substantially perpendicular to the ion trajectories. FIG. 5C shows the magnet 502 having a magnetic field that is substantially perpendicular to the trajectory of ion emissions from to the exit plans 512 to a substrate.

In addition to having a substantially perpendicular magnetic field to the trajectory of the emitted ions, the magnetic field also increases in density from the anode to the exit planes 512. The magnitude of the magnetic field density (shown in varying shades in FIG. 5D) may follow a gradient distribution with a starting value (e.g., a minimum value of magnetic intensity) near the anode that is gradually increased to a maximum intensity at the exit plane 512 of the discharge channel. In certain example embodiments, the maximum value of the magnetic field density (B) may be adjusted using permanent magnets of various values 20-50 MGOs, (megagauss-oersteds) SmCo (samarium-cobalt, or equivalent) magnets (e.g., which may be installed in the body of the ion source) such that a total ion source discharge current is reduced for a given operating condition. Such adjustments may facilitate efficiencies increases (e.g., towards a maximum efficiency). Such operating conditions may include, for example, gas type, flow, pressure, and/or voltage. For example, operating conditions for large area coatings may have a magnetic field density value range of 200-900 Gauss (2.0e-2 to 9.0e-2 Tesla).

It will be appreciated that the magnetic field geometry and/or intensity may affect the process and operational stability of the ion source, deposition rates, maximum gas flows and pressures, overall efficiency, process, and equipment longevity (e.g., relates to erosion and/or contamination).

In certain example embodiments an exemplary ion source apparatus may be used for direct coating deposition (e.g., diamond like carbon, etc.), substrate surface cleaning and activations, surface roughness alteration, ion beam assisted deposition (IBAD) for coating densification, dopant implantations, coating phase alteration, and/or the like.

In certain example embodiments, carbon based precursors, such as, for example, alkane, alkene, and/or alkyne inclusive gasses, which may be used as precursors. In certain example embodiments, methane can be used (e.g., instead of acetylene or the like) as a precursor gas for the deposition of DLC. Usage of methane and/or alkane, alkene, alkyne, etc., inclusive gasses may have advantages such as, for example, the DLC coating having reduced light absorption (e.g., a clearer coating). The usage of methane may provide safety benefits as it may be safer to handle and/or implement in commercial environments than other types of precursors (e.g., acetylene).

In certain example embodiments, exemplary techniques herein may have the same or similar scratch resistance properties to conventional DLC products while having additional benefits.

In certain example embodiments, the coating visible light absorption may be between 2% and 4%. In certain example embodiments, the deposition rate may be increased over conventional techniques. For example the deposition rate may be about two times the rate of other conventional sources.

In certain example embodiments (e.g., for the deposition of DLC), example ion sources may operate with methane instead of acetylene. This may have safety benefits and be more "production friendly" for the commercial uses.

In certain example embodiments, a higher ion current density is achieved (e.g., more ions per unit of time) than conventional ion sources.

In certain example embodiments, the discharge voltage may be relatively lower than that of conventional ion source devices. This may result in less energetic ions than those produced from a conventional ion source.

In certain example embodiments, the relationship between ion current density and depositions may results in higher ion beam current and higher process DDR.

In certain example embodiments, the construction of an ion source apparatus may reduce the carbon contamination build up incurred during the DLC deposition process.

In certain example embodiments, an ion beam source is provided that is configured to emit an ion beam in a direction of a substrate. The ion source includes a cathode that at least partially defines a discharge opening, the discharge opening having a predetermined width. An anode is located spaced apart from the cathode by a predetermined depth, the direction in which the ion beam is to be emitted being substantially parallel to a direction from the anode to the discharge opening in the cathode. First and second ceramic walls at least partially define a discharge channel between the anode and the cathode. At least one magnet is provided that is configured to generate a magnetic field in at least the discharge opening.

In accordance with the previous paragraph, the predetermined width may be between about 10 mm and 25 mm.

In accordance with the previous paragraph, the predetermined width may be between about 15 mm and 20 mm.

In accordance with any one of the previous three paragraphs, the predetermined depth may be between about 25 mm-55 mm.

In accordance with any one of the previous four paragraphs, the predetermined depth may be between about 30 mm-50 mm.

In accordance with any one of the previous five paragraphs, a ratio of the predetermined depth to predetermined width may be 2-2.5 to 1.

In accordance with any one of the previous six paragraphs, the magnetic field that is to be generated by the at least one magnet may be made to increase in density between the anode and the discharge opening.

In accordance with the previous paragraph, the density of the magnetic field that is to be generated by the at least one magnet may be at or near a maximum in an area proximate to the discharge opening.

In accordance with either of the previous two paragraphs, the density of the magnetic field at the ion exit plane (e.g., mid-channel), or other discharge opening, may be between about 2.0e-2 to 9.0e-2 Tesla.

In accordance with any one of the previous nine paragraphs, the magnetic field may be substantially perpendicular to an emission trajectory of emitted ions.

In accordance with any one of the previous ten paragraphs, the ceramic walls may comprise one or more of Bn; $BnSiO_2$; and $Al_2O_3$.

In accordance with any one of the previous eleven paragraphs, the ceramic walls may function as low energy secondary electrons to a plasma discharge at the discharge opening.

In accordance with any one of the previous twelve paragraphs, the first ceramic wall may be longer than the second ceramic barrier wall.

In accordance with the previous paragraph, the first ceramic wall may be an interior barrier wall and extend into a body portion of the ion source past the anode.

In certain example embodiments, a method of ion depositing a layer on a substrate is provided. An ion source is provided, with the ion source including: at least one cathode; an anode that is located proximate to an aperture defined in the cathode, the aperture having a predetermined width and a predetermined depth that separates the anode from the aperture; at least one magnet that generates a magnetic field proximate to the aperture defined in the cathodes; first and second ceramic barrier walls at least partially define a passage between the anode and the aperture in the cathode. A gas is provided to an area proximate to the aperture defined in the cathode, the provided gas being ionized and emitted towards the substrate.

In accordance with the previous paragraph, the predetermined width may be between about 15 mm and 20 mm.

In accordance with either of the two previous paragraphs, the predetermined depth may be between about 30 mm and 50 mm.

In accordance with any of the three previous paragraphs, a ratio of the predetermined depth to predetermined width may be 2-2.5 to 1.

In accordance with any of the four previous paragraphs, the generated magnetic field may increase in density between the anode and the aperture.

In accordance with any of the five previous paragraphs, a density of the generated magnetic field at the aperture may be at or near a maximum in an area proximate to the aperture.

In accordance with any of the six previous paragraphs, density of the generated magnetic field at the aperture is between about 2.0e-2 to 9.0e-2 Tesla.

In accordance with any of the seven previous paragraphs, the magnetic field may be substantially perpendicular to an emission trajectory of the ionized gas.

In accordance with any of the eight previous paragraphs, the at least one gas includes an alkane-inclusive gas.

While the materials shown for the various layers in the drawings are preferred materials in certain example embodiments of this invention, they are not intended to be limited unless expressly claimed. Other materials may be used to replace materials shown in the drawings in alternative example embodiments of this invention. Moreover, certain layers may be removed, and other layers added, in alternative embodiments of this invention. Likewise, where shown the illustrated thicknesses also are not intended to be limiting unless expressly claimed.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An ion beam source that is configured to emit an ion beam in a direction of a substrate, the ion beam source comprising:
    a cathode that includes a discharge opening defined therein, the discharge opening having a predetermined width;
    an anode located spaced apart from the cathode by a predetermined depth, the direction in which the ion beam is to be emitted being substantially parallel to a direction from the anode to the discharge opening in the cathode;
    first and second ceramic walls that are located between the anode and the cathode and at least partially define a discharge channel between the anode and the cathode; and
    at least one magnet that is shaped, arranged, and located in the ion beam source to generate a magnetic field that increases in density in general accordance with a gradient distribution with a low proximate the anode to a high at or proximate the discharge opening, and with magnetic field lines that run substantially perpendicular to an emmission trajectory of emitted ions within the discharge channel.

2. The ion beam source of claim 1, wherein the predetermined width is between about 10 mm and 25 mm.

3. The ion beam source of claim 2, wherein the predetermined width is between about 15 mm and 20 mm.

4. The ion beam source of claim 1, wherein the predetermined depth is between about 25 mm-55 mm.

5. The ion beam source of claim 4, wherein the predetermined depth is between about 30 mm-50 mm.

6. The ion beam source of claim 1, wherein a ratio of the predetermined depth to predetermined width is 2-2.5 to 1.

7. The ion beam source of claim 1, wherein the density of the magnetic field at the discharge opening is between 2.0e-2 to 9.0e-2 Tesla.

8. The ion beam source of claim 1, wherein the ceramic walls comprise one or more of Bn; $BnSiO_2$; and $Al_2O_3$.

9. The ion beam source of claim 1, wherein the ceramic walls function as low energy secondary electrons emitter to a plasma discharge at the discharge opening.

10. The ion beam source of claim 1, wherein the first ceramic wall is longer than the second ceramic barrier wall.

11. The ion beam source of claim 10, wherein the first ceramic wall is an interior barrier wall and extends into a body portion of the ion source past the anode.

12. The ion beam source of claim 1, wherein the at least one magnet is made from a material selected to control the maximum density such that the ion source discharge current at or proximate the aperture is sufficiently low for selected gas- and current-related operating conditions.

13. The ion beam source of claim 12, wherein the at least one magnet is a permanent magnet of or including 30 MGOs SmCo.

14. The ion beam source of claim 12, wherein the selected gas- and current-related operating conditions include gas type, flow, and pressure.

15. A method of ion depositing a layer on a substrate in connection with an ion source that includes at least one cathode, an anode located proximate to an aperture defined in the cathode, the aperture having a predetermined width and a predetermined depth that separates the anode from the aperture, at least one magnet for generating a magnetic field, and first and second ceramic barrier walls provided within the ion source and at least partially defining a passage between the anode and the aperture in the cathode, the method comprising:

providing power to the at least one magnet to generate the magnetic field, the at least one magnet being shaped, arranged, and located in the ion source such that the generated magnetic field increases in density with a low proximate the anode to a high at or proximate the aperture;

controlling the maximum density such that the ion source discharge current at or proximate the aperture is sufficiently low for selected gas- and current-related operating conditions, and providing at least one gas to an area proximate to the aperture defined in the cathode, the provided gas being ionized and emitted towards the substrate.

16. The method of claim 15, wherein the predetermined width is between about 15 mm and 20 mm.

17. The method of claim 15, wherein the predetermined depth is between about 30 mm and 50 mm.

18. The method of claim 15, wherein a ratio of the predetermined depth to predetermined width is 2-2.5 to 1.

19. The method of claim 15, wherein density of the generated magnetic field at the aperture is between about 2.0e-2 to 9.0e-2 Tesla.

20. The method of claim 15, wherein the magnetic field is substantially perpendicular to an emission trajectory of the ionized gas.

21. The method of claim 20, wherein the controlling is at least partially accomplished through selection of the material making up the at least one magnet.

22. The ion beam source of claim 21, wherein the selected gas- and current-related operating conditions include gas type, flow, and pressure.

23. The method of claim 15, wherein the at least one gas includes an alkane-inclusive gas.

* * * * *